United States Patent
Cho et al.

(10) Patent No.: US 9,496,890 B2
(45) Date of Patent: Nov. 15, 2016

(54) LOOP FILTER FOR DATA CONVERTER IN WIRELESS COMMUNICATION SYSTEM AND METHOD OF IMPLEMENTING CORRESPONDING LOOP FILTER

(71) Applicant: Electronics and Telecommunications Research Institute, Daejeon (KR)

(72) Inventors: Young Kyun Cho, Daejeon (KR); Bong Hyuk Park, Daejeon (KR); Jung Hoon Oh, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/057,793

(22) Filed: Mar. 1, 2016

(65) Prior Publication Data

US 2016/0269043 A1  Sep. 15, 2016

(30) Foreign Application Priority Data

Mar. 9, 2015 (KR) .................. 10-2015-0032620

(51) Int. Cl.
  *H03M 3/00* (2006.01)
  *H03H 11/12* (2006.01)
  *G06G 7/18* (2006.01)

(52) U.S. Cl.
  CPC ............. *H03M 3/44* (2013.01); *H03H 11/126* (2013.01); *H03M 3/438* (2013.01); *G06G 7/18* (2013.01)

(58) Field of Classification Search
  CPC .................. H03M 3/32; H03M 3/402–3/406; H03H 11/04–11/0466; H03H 11/12–11/1204; H03H 11/126–11/1286
  See application file for complete search history.

(56) References Cited

U.S. PATENT DOCUMENTS 4,553,103 A * 11/1985 Rollett ............... H03H 11/1295
  327/552
5,243,345 A    9/1993 Naus et al.
(Continued)

FOREIGN PATENT DOCUMENTS

KR  10-2015-0084267 A  7/2015
KR  10-2015-0094906 A  8/2015

OTHER PUBLICATIONS

Weng et al., A 13-MHz 68-dB SNDR CTDSM Using SAB Loop Filter and Interpolating Flash Quantizer with Random-Skip IDWA Function in 90-nm CMOS, IEEE Asian Solid-State Circuits Conference, Nov. 9-11, 2015.*

(Continued)

*Primary Examiner* — Howard Williams
(74) *Attorney, Agent, or Firm* — NSIP Law

(57) ABSTRACT

Provided is a loop filter for a data converter in a wireless communication system that improves both an anti-aliasing filtering characteristic and a power consumption characteristic, the loop filter including first and third resistors sequentially connected to an input end, fourth and second resistors sequentially connected to between an inverting output end and ground, a first capacitor connected to between another end of the first resistor and one end of the fourth resistor, a second capacitor connected to between the one end of the fourth resistor and the output end, a third capacitor connected to between another end of the third resistor and the output end, and an operational amplifier, wherein an inverting end of the operational amplifier is connected to the other end of the first resistor and a non-inverting end of the operational amplifier is connected to ground to output an operational amplifier response to the output end.

14 Claims, 10 Drawing Sheets

(56) References Cited

U.S. PATENT DOCUMENTS

| | | |
|---|---|---|
| 6,831,497 B2 | 12/2004 | Koh et al. |
| 8,258,990 B2 | 9/2012 | Dosho et al. |
| 8,604,956 B2 * | 12/2013 | Dosho ................ H03H 11/1252 327/554 |
| 8,674,864 B2 * | 3/2014 | Dosho .................... H03M 3/39 341/143 |
| 8,749,414 B2 | 6/2014 | Cho et al. |
| 8,816,758 B2 * | 8/2014 | Ganger ................ H03H 11/126 327/551 |
| 8,823,567 B2 * | 9/2014 | Mitani ................... H03H 11/04 341/143 |
| 8,937,567 B2 * | 1/2015 | Obata ................... H03M 3/438 341/143 |
| 2012/0212288 A1 * | 8/2012 | Masui ............... H03H 11/0427 327/557 |
| 2015/0200678 A1 | 7/2015 | Cho et al. |
| 2015/0229292 A1 | 8/2015 | Cho et al. |

OTHER PUBLICATIONS

Ramin Zanbaghi, et al., "A Novel Low Power Hybrid Loop Filter for Continuous-Time Sigma-Delta Modulators", IEEE, 2009, pp. 3114-3117.

Kazuo Matsukawa, et al., "A Fifth-Order Continuous-Time Delta-Sigma Modulator With Single-Opamp Resonator", IEEE Journal of Solid-State Circuits, vol. 45, No. 4, pp. 697-706, Apr. 2010, pp. 697-706.

Kazuo Matsukawa, et al., "A 10 MHz BW 50 fJ/conv. Continuous Time ΔΣ Modulator with High-Order Single Opamp Integrator using Optimization-based Design Method", IEEE, 2012, pp. 160-161.

Ramin Zanbaghi, et al., "An 80-dB DR,7.2-MHz Bandwith Single Opamp Biquad Based CT ΔΣ Modulator Dissipating 13.7-mW", IEEE Journal of Solid-State Circuits, vol. 48, No. 2, Feb. 2013, pp. 487-501.

* cited by examiner

LOOP FILTER FOR DATA CONVERTER IN WIRELESS COMMUNICATION SYSTEM AND METHOD OF IMPLEMENTING CORRESPONDING LOOP FILTER

CROSS-REFERENCE TO RELATED APPLICATIONS

This U.S. non-provisional patent application claims priority under 35 U.S.C. §119 of Korean Patent Application No. 10-2015-0032620, filed on Mar. 9, 2015, the entire contents of which are hereby incorporated by reference.

BACKGROUND

The present disclosure herein relates to a loop filter for a continuous time delta-sigma modulator, and more particularly, to a third order loop filter based on a single operational filter and a method of implementing a corresponding loop filter.

A continuous time delta-sigma modulator (DSM) has its own anti-aliasing characteristic and a high signal to noise ratio (SNR) characteristic. Thus, the DSM is being widely used as a data converter for efficiently implementing a wireless communication system, such as 3rd Generation Partnership Project (3GPP), Worldwide Interoperability for Microwave Access (WiMAX), etc.

With the recent development in process technology, interest in low power has increased and thus many efforts to design the DSM with low power are being made. A loop filter (LF) among blocks configuring the DSM is a block that requires greatest power consumption in design. R. Zanbaghi's 2013 JSSC paper entitled "An 80-dB DR, 7.2-MHz Bandwidth Single Opamp Biquad Based CT A/Modulator Dissipating 13.7 mW" and K. Matsukawa's 2010 JSSC paper entitled "A fifth order Continuous-time Delta-Sigma Modulator With Single-Opamp Resonator" have proposed DSMs that configure a multi-order LF using a single operational trans-conductance amplifier (OTA). Unlike a typical manner in which the number of integrators increases with an increase in order, the DSMs employs, as a main idea, configuring a multi-order LF through a single OTA and thus reducing the power consumption of the entire circuit. Also, a method of configuring a second order LF through a single operation amplifier has been presented in Korean Patent Application Nos. 10-2014-0015799 and 10-2014-0004103 entitled "Second order LF and multi-order delta-sigma modulator including the same" and "Delta-sigma modulator", respectively.

In a typical art as described above, LF structures are disclosed which may reduce the power consumption and area of the DSM by the configuring of a second order LF using a single operational amplifier. However, it is difficult to find a third order filter implemented by using a single operational amplifier. The reason is that when the order of the LF is equal to or higher than a third order, it is difficult to find a circuit configuration that satisfies a third order transfer function through a connection of a resistor and a capacitor. The reason is also that a resistor value and a capacitor value changes according to a change in process used for implementing a circuit, thus it is significantly difficult to provide a stable LF.

In this situation, Matsukawa from Panasonic corporation has proposed a third order LF in A 10 MHz BW 50 fJ/conv. Continuous Time ΔΣModulator with High-order Single Opamp Integrator Using Optimization-based Design Method", in Symposium on VLSI Circuits, 2012.

However, in order to implement the proposed circuit, correction should be performed based on simulation after all parasitic components present in the circuit and an operational amplifier have been modeled. Therefore, there are many difficulties in actually manufacturing and implementing the LF.

SUMMARY

The present disclosure provides a loop filter (LF) for a data converter in a wireless communication system that improves both of an anti-aliasing filtering characteristic and a power consumption characteristic, and a method of implementing a corresponding LF.

The present disclosure also provides a method of implementing a LF that may implement a third order LF using only a single operational amplifier when implementing a LF for a continuous time delta-sigma modulator.

Embodiments of the inventive concept provides loop filters for a data converter in a wireless communication system, the loop filter including first and third resistors sequentially connected to an input end; fourth and second resistors sequentially connected to between an inverting output end and ground; a first capacitor connected to between another end of the first resistor and one end of the fourth resistor; a second capacitor connected to between the one end of the fourth resistor and the output end; a third capacitor connected to between another end of the third resistor and the output end; and an operational amplifier configured to output an operational amplifier response to the output end, wherein an inverting end of the operational amplifier is connected to the other end of the first resistor and a non-inverting end of the operational amplifier is connected to ground.

In an embodiment, an output signal opposite to when a differential circuit is implemented may be applied to between another end of the fourth resistor and the output end.

In embodiments of the inventive concept, methods of implementing a loop filter include forming a loop filter for a continuous time signal delta modulator (SDM), in a feedback loop structure; configuring the loop filter in the feedback loop structure to enable the loop filter to be entirely expressed by a first single transfer function; substituting a feedforward loop structure for the loop filter in the feedback loop structure; and configuring the loop filter in the feedforward loop structure obtained through substitution to enable the loop filter to be entirely expressed by a second single transfer function.

In embodiments of the inventive concept, loop filters for a data converter in a wireless communication system include third and first resistors sequentially connected to an input end; a second resistor, one end of which is connected to an inverting input end; first and second capacitors sequentially connected to between another end of the first resistor and an output end; a third capacitor connected to between the other end of the first resistor and the output end; a fourth capacitor connected to between another end of the second resistor and an inverting output end; and an operational amplifier configured to output an operational amplifier response to the output end, wherein an inverting end of the operational amplifier is connected to another end of the third resistor and a non-inverting end of the operational amplifier is connected to ground.

In embodiments of the inventive concept, methods of implementing a loop filter include forming a loop filter for a third order continuous time SDM, in a feedback loop structure by using at least three operational amplifiers and capacitors; configuring the loop filter in the feedback loop structure to enable the loop filter to be entirely expressed by a first single transfer function; substituting a feedforward loop structure for the loop filter in the feedback loop structure; and configuring the loop filter in the feedforward loop structure obtained through substitution to enable the loop filter to be entirely expressed by a second single transfer function.

In an embodiment, the first single transfer function and the second single transfer function may have different coefficients but are expressed in a same form.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
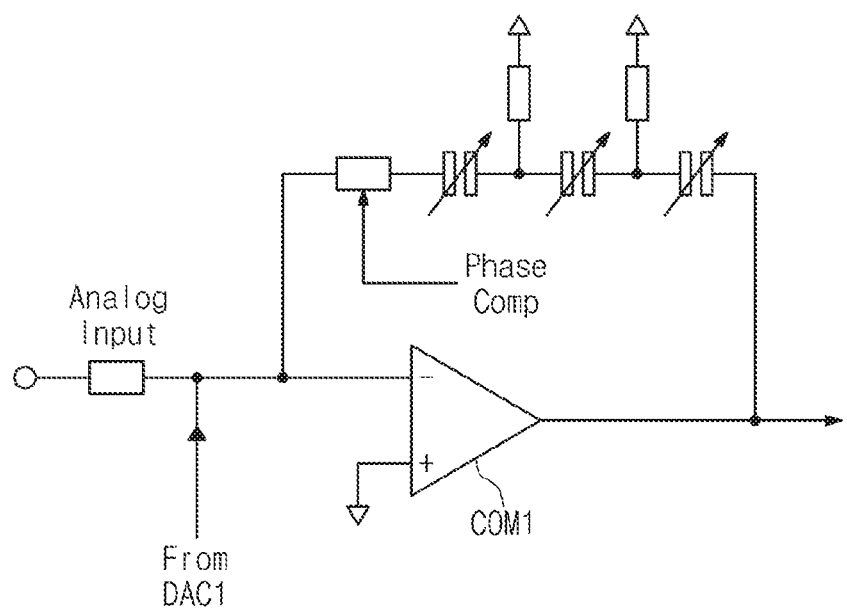
FIG. 1 is a circuit configuration diagram of a general third order loop filter (LF)

The objects, other objects, features and advantages of the inventive concept as described above would be easily understood through the following exemplary embodiments related to the accompanying drawings. However, the inventive concept is not limited to embodiments described herein but may also be embodied in other forms. Rather, embodiments introduced herein are provided to make the disclosed contents more thorough and complete and to fully convey the spirit of the inventive concept to a person skilled in the art, without other intents except for providing the convenience of understanding.

When the inventive concept mentions that any elements or lines are connected to target element blocks, it includes a direct connection and an indirect connection that the elements are connected to the target element blocks through some other elements.

Also, the same or similar reference numerals presented in each drawing represent the same or similar components if possible. In some drawings, the connection of elements and lines are only represented for the effective description of the technical contents and other elements or circuit blocks may be further included.

Each embodiment described and illustrated herein may also include its complementary embodiment and it should be noted that the general operation of a delta-sigma modulator (DSM) or the details of a fundamental circuit are not described in order not to obscure the subject of the inventive concept.

In the following, the exemplary embodiments of the inventive concept are described in detail with reference to the accompanying drawings.

FIG. 1 is a circuit configuration diagram of a general third order loop filter (LF). The circuit configuration of the third order LF shown in FIG. 1 has been proposed by Matsukawa for Panasonic Corporation, in Symposium on VLSI Circuits, 2012. Matsukawa has disclosed a third order LF that has a single operational amplifier, entitled ""A 10 MHz BW 50 fJ/conv Continuous Time ΔΣModulator with High-order Single Opamp Integrator Using Optimization-based Design Method". However, in order to implement the Matsukawa's circuit, there is a need to model all parasitic components present in a circuit and an operational amplifier and perform correction based on simulation. In conclusion, it is significantly difficult to actually manufacture and implement the Matsukawa's LF.

Figure 2:
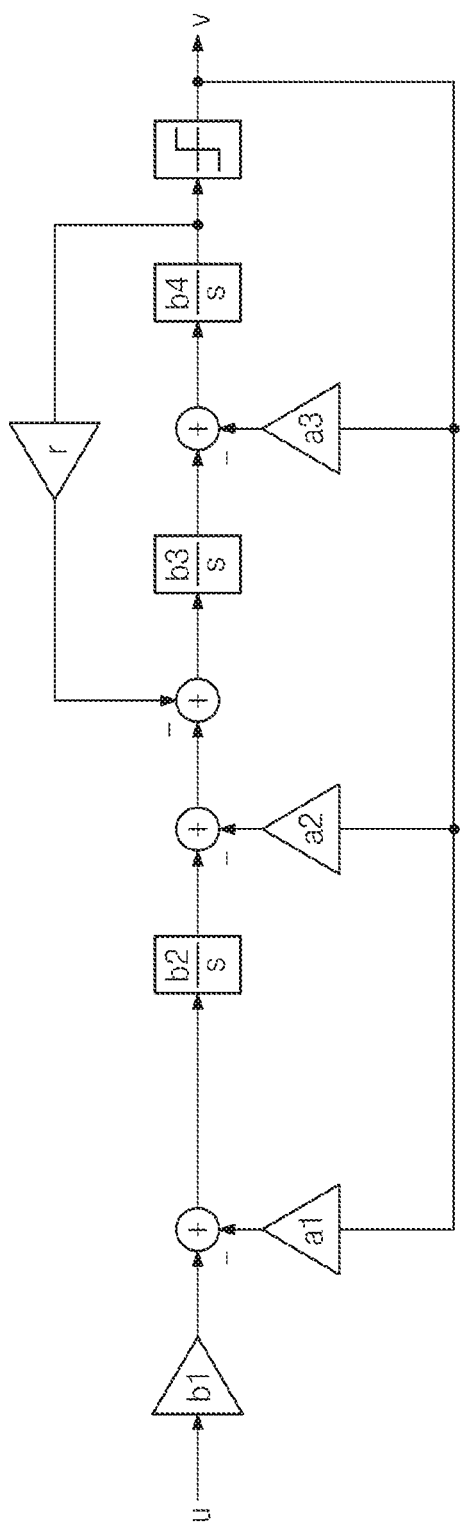
FIG. 2 is a diagram representing the signal flow of a third order continuous time delta-sigma modulator (DSM) of a general feedback type.

FIG. 2 is a diagram representing the signal flow of a third order continuous time delta-sigma modulator (DSM) of a general feedback type.

{Referring to FIG. 2, the DSM is a third order DSM that includes three integrators b2/s, b3/s, and b4/s three feedback DACs a1, a2, and a3, and a feedback loop r.

In this case, the feedback loop r is used for zero optimization.

Although FIG. 2 does not show a loop for compensating for an excess loop delay (ELD) for the convenience of description and illustration, it is possible to use a method of implementing a circuit as shown in FIG. 2 even when the ELD compensation circuit is added. In FIG. 2, the three integrators b2/s, b3/s, and b4/s and the feedback loop r for zero optimization may configure an LF.

Figure 3:
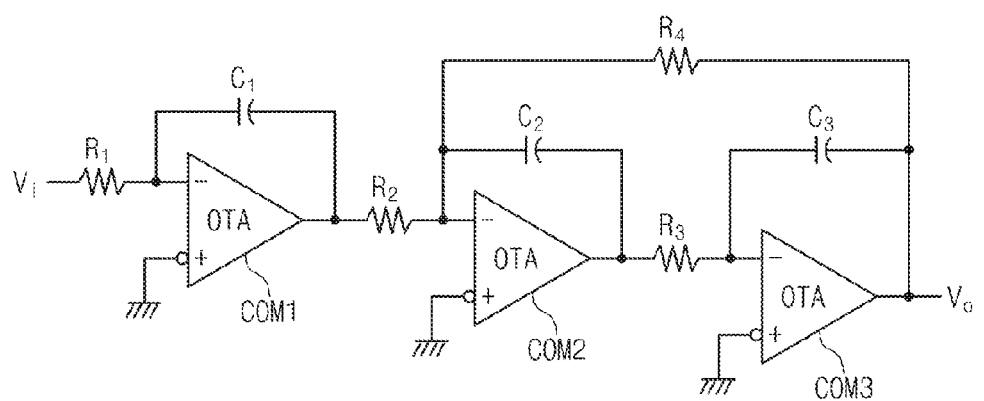
FIG. 3 is a circuit configuration diagram of an LF applied to the implementation of FIG. 2.

In order to implement the DSM as shown in FIG. 2, the LF of FIG. 2 may include three operational amplifiers COM1 to COM3, three capacitors C1 to C3, and four resistors R1 to R4 as shown in FIG. 3. FIG. 3 is a circuit configuration diagram of an LF applied to the implementation of FIG. 2.

When as shown in FIG. 3, a plurality of operational amplifiers COM1 to COM3 is used in order to implement the LF, the entire area and power consumption of a circuit may increase. Therefore, in order to decrease the area and power consumption of the entire circuit, there may be a need to substitute a feedforward loop as shown in FIG. 4 for the feedback loop as shown in FIG. 2 and express the entire LF as a single transfer function.

Figure 4:
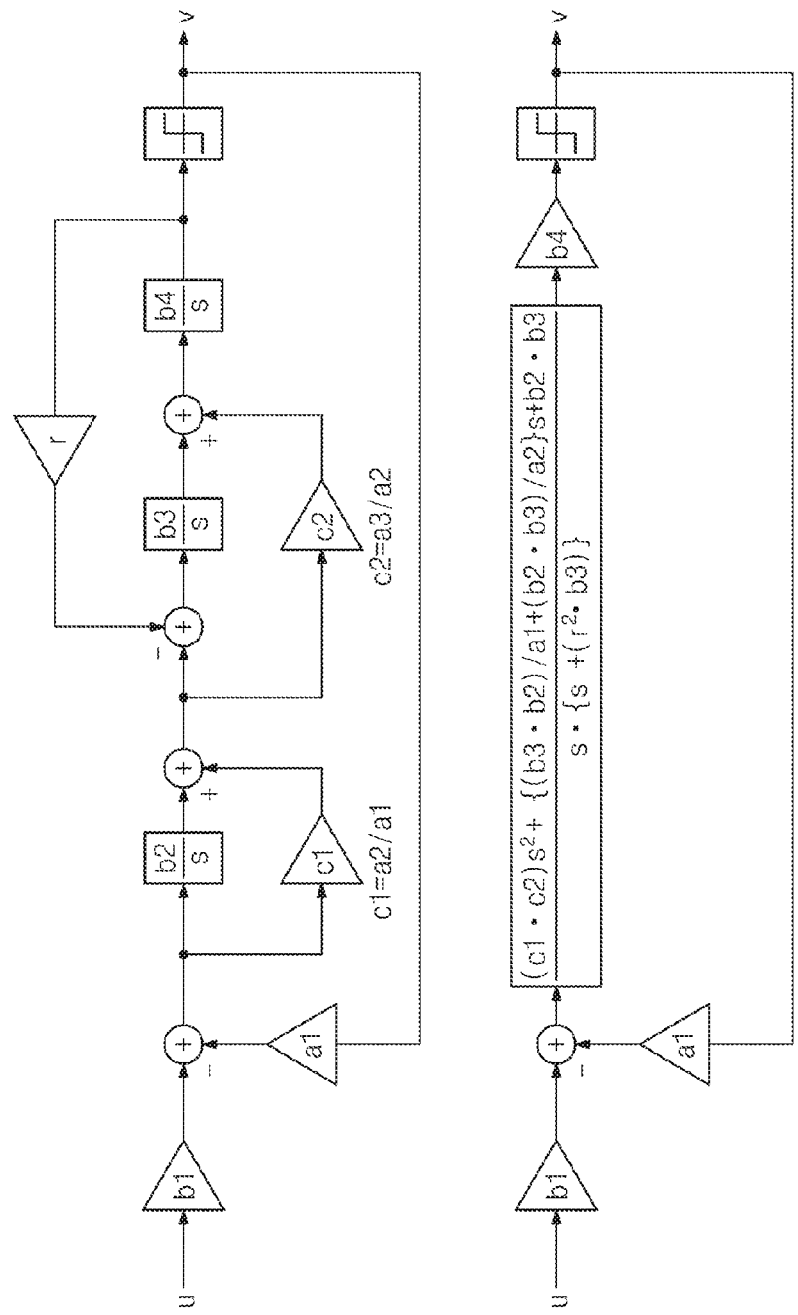
FIG. 4 is a diagram representing the loop subsitution and LF transfer function of the third order continuous time DSM of a first feedforward type.

FIG. 4 is a diagram representing the loop substitution and LF transfer function of a third order continuous time DSM of a first feedforward type.

Referring to FIG. 4, the DSM may include three integrators b2/s, b3/s, and b4/s, a single feedback DAC a1, two feedforward paths C1(=a2/a1) and C2(=a3/a2), and a feedback loop r.

The DSM shown on the upper part of FIG. 4 may be expressed as a single transfer function as shown on the lower part of FIG. 4.

Figure 5:
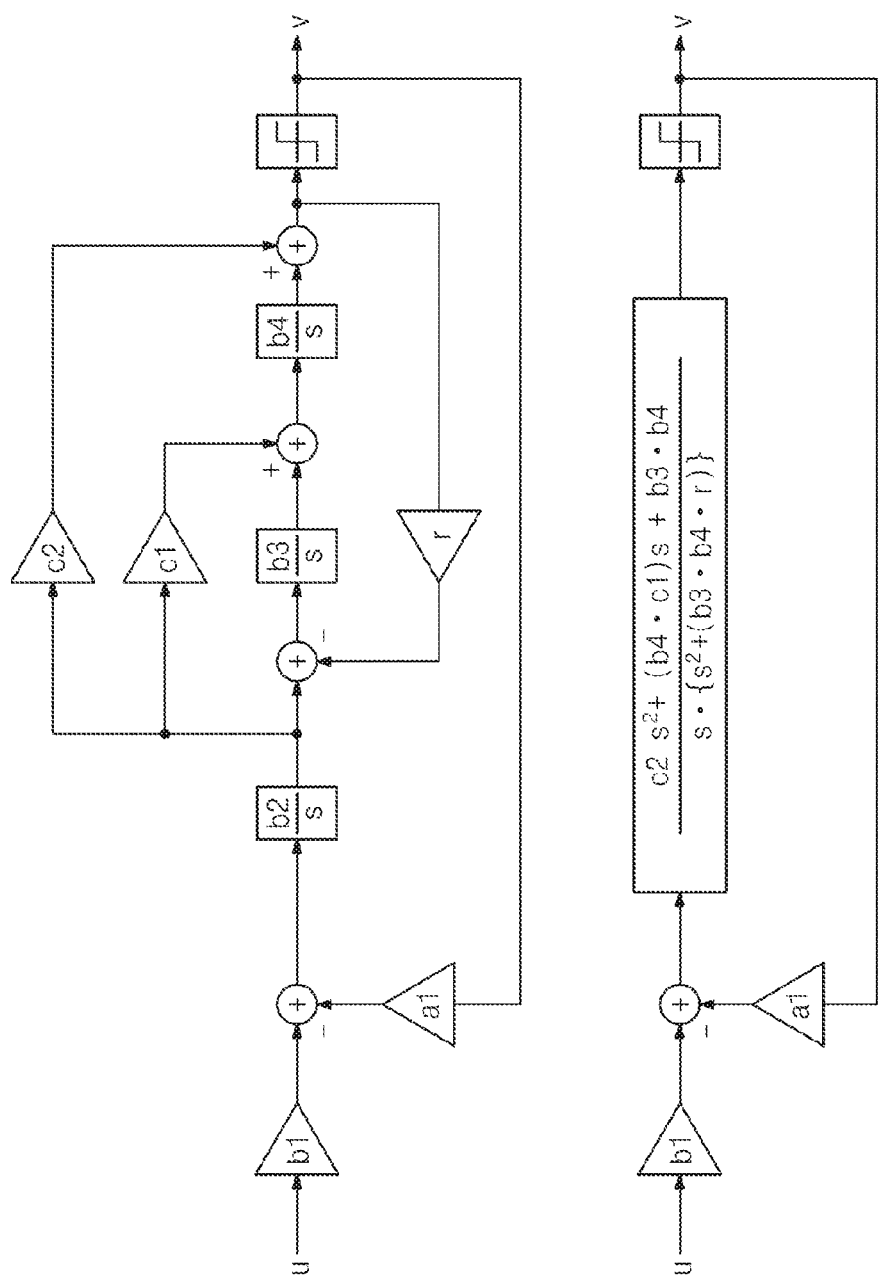
FIG. 5 is a diagram representing the loop subsitution and LF transfer function of the third order continuous time DSM of a second feedforward type.

FIG. 5 is a diagram representing the loop substitution and LF transfer function of a third order continuous time DSM of a second feedforward type.

Referring to FIG. 5, the DSM may include three integrators b2/s, b3/s, and b4/s, a single feedback DAC a1, two feedforward paths C1 and C2, and a feedback loop r.

Likewise, the DSM shown on the upper part of FIG. 5 may be expressed as a single transfer function as shown on the lower part of FIG. 5.

In conclusion, even in the case of the DSM of the second feedforward type as shown in FIG. 5, the LF may be expressed as the single transfer function. It may be seen that two cases of FIGS. 4 and 5 only show a difference in coefficient value and have a transfer function of the same type. However, in designing the DSM, the first feedforward structure of FIG. has more advantages than the second feedforward structure of FIG. 5, the reason of which is as follows.

Figure 6:
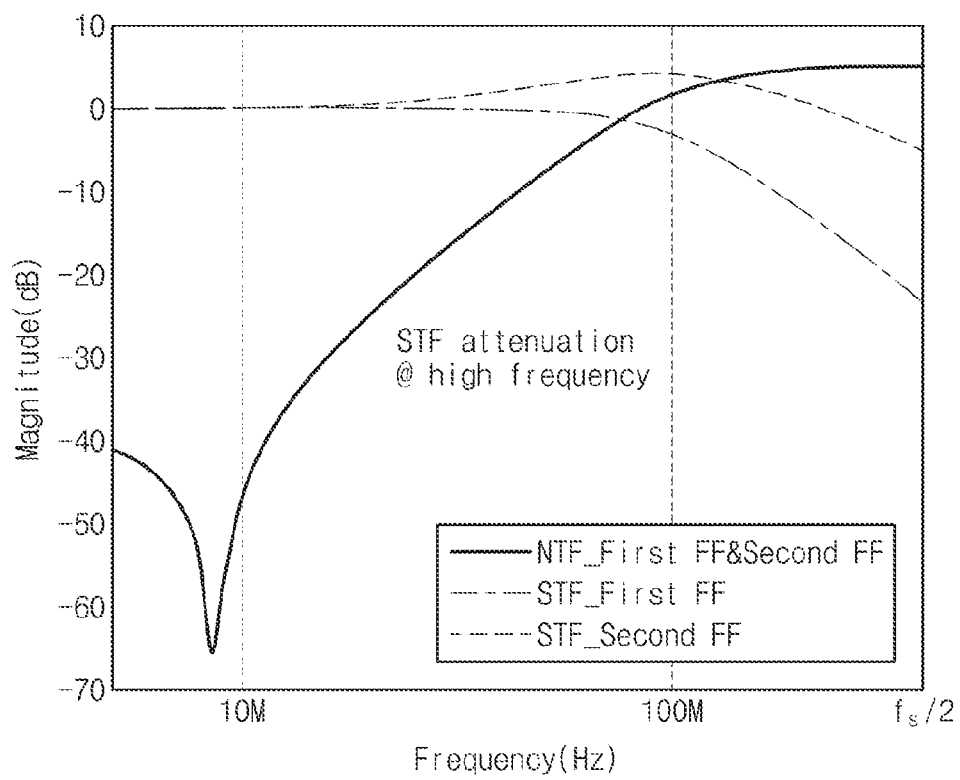
FIG. 6 is a diagram representing a signal transfer function and a noise transfer function related to FIGS. 4 and 5.

In order to decrease the power consumption of the DSM, the second feedforward type is more preferred than the first feedforward type. However, in the case of the second feedforward structure, the attenuation of a signal is not correctly performed on a high frequency region as shown in FIG. 6. Therefore, it is difficult to properly use the characteristic of an anti-aliasing filter that is an advantage of the continuous time DSM. Thus, a method of increasing the power consumption of an integrator by removing a signal fed back to an internal node is generally used in designing the continuous time DSM.

FIG. 6 is a diagram representing a signal transfer function and a noise transfer function related to FIGS. 4 and 5.

In FIG. 6, the horizontal axis represents frequency and the vertical axis represents magnitude. The graph indicated by a solid line shows a noise transfer function in a feedforward structure and a second feedforward structure. The graph indicated by an alternate long and short dash line represents a signal transfer function in the first feedforward structure and the graph indicated by a broken line represents a signal transfer function in the second feedforward structure.

An embodiment of the inventive concept uses the first feedforward structure and then obtains a single transfer function through loop substitution. Thus, a high anti-aliasing filtering characteristic that is an advantage of a feedback structure is obtained and a low power consumption characteristic that is an advantage of a feedforward structure may be simultaneously obtained.

It is now important whether it is possible to implement each third order transfer function irrespective of a loop structure. Embodiments of the inventive concept describe a third order integrator circuit of two exemplary structures, i.e., a third order LF.

Figure 7:
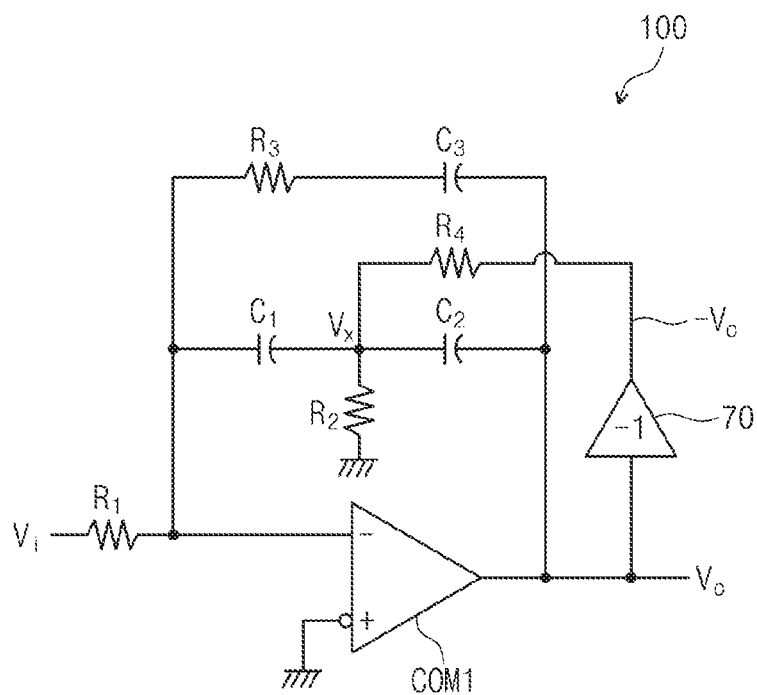
FIG. 7 is a circuit configuration diagram of a third order loop filter that has a single operational amplifier according to an embodiment of the inventive concept.

FIG. 7 is a circuit configuration diagram of a third order LF that has a single operational amplifier according to an embodiment of the inventive concept.

Firstly, referring to FIG. 7, a LF for a data converter in a wireless communication system includes first and third resistors R1 and R3 connected to an input end (Vi), fourth and second resistors R4 and R2 that are sequentially connected to between an inverting output end −Vo and ground, a first capacitor C1 connected to between another end of the first resistor R1 and one end of the fourth resistor R4, a second capacitor C2 connected to the one end of the fourth resistor R4 and the output end Vo, a third capacitor C3 connected to between another end of the third resistor R3 and the output end Vo, and an operational amplifier COM1, wherein an inverting end (−) of the operational amplifier is connected to the other end of the first resistor R1 and a non-inverting end (+) of the operational amplifier is connected to ground so that an operational amplifier response is output to the output end Vo.

In conclusion, the third order LF of FIG. 7 that represents a first embodiment includes a single operational amplifier COM1, four resistors F1 to F4, and three capacitors C1 to C3, so the number of operational amplifiers thereof decreases by two in comparison to a typical LF of FIG. 3.

The number −1 indicated by reference numeral 70 in FIG. 7 represents a signal applied from an opposite circuit output when a fully differential circuit is implemented. A difference between typical technologies and the proposed circuit configuration of FIG. 7 is a serial connection between the resistor R3 and the capacitor C3. Since the impedance of (SC3R3+1)/SC4 is formed through the serial connection, a third order transfer function may be expressed. That is, it is possible to implement a third order transfer function only through such a serial connection.

The transfer function of the proposed loop circuit of FIG. 7 may be expressed as follows:

$$\frac{V_o}{V_i} = -\frac{\left(\frac{1}{C_1R_1} + \frac{1}{C_2R_1}\right)\cdot s^2 + \left\{\frac{1}{C_1C_2R_1}\cdot\left(\frac{1}{R_2} + \frac{1}{R_4}\right) + \frac{1}{C_3R_1R_3}\cdot\left(\frac{1}{C_1} + \frac{1}{C_2}\right)\right\}\cdot s + \frac{1}{C_1C_2C_3R_1R_3}\left(\frac{1}{R_2} + \frac{1}{R_4}\right)}{s\cdot\left[s^2 + \left\{\frac{1}{R_3}\left(\frac{1}{C_1} + \frac{1}{C_2} + \frac{1}{C_3}\right) - \frac{1}{R_4}\left(\frac{1}{C_2}\right)\right\}\cdot s + \frac{1}{C_2R_3}\cdot\left(\frac{1}{C_1R_2} + \frac{1}{C_1R_4} - \frac{1}{C_3R_4}\right)\right]}.$$

The form of such a transfer function enables the form of the transfer function presented in FIGS. 4 and 5 to be implemented. In order to configure a circuit in the same form as the transfer function presented in FIGS. 4 and 5, the term $s^2$ of denominator should be zero and thus the following resonance condition should be satisfied:

$R_4\cdot(C_1C_3+C_2C_3+C_1C_3)=R_3\cdot(C_1C_3)$.

Thus, in order to satisfy the resonance condition of a circuit according to a process-voltage-temperature (PVT) variation, design may be performed so that the resistor R3 or R4 is adjusted. Also, it is possible to cope with the PVT variation by adjusting the capacitors C1 and C2 or capacitors C2 and C3, as well as resistors.

The circuit of the LF as shown in FIG. 7 is a filter one order higher than Korean Patent Application No. 10-2014-0015799, entitled "Second order loop filter and multi-order delta-sigma modulator including the same". In this example, by simply adding one resistor in order to raise one order, it is possible to satisfy a transfer function. Therefore, a smaller area and low power consumption are enabled through the LF, so it is possible to provide a modulator having a high SNR.

Figure 8:
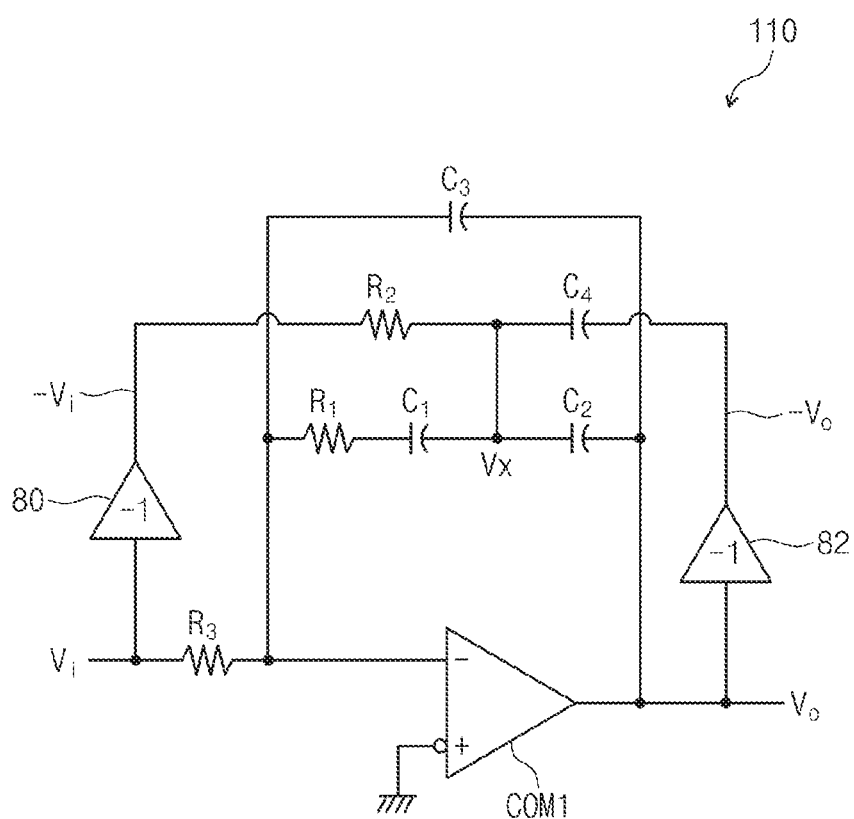
FIG. 8 is a circuit configuration diagram of a third order loop filter that has a single operational amplifier according to another embodiment of the inventive concept.

FIG. 8 is a circuit configuration diagram of a third order loop filter that has a single operational amplifier according to another embodiment of the inventive concept.

Referring to FIG. 8, an LF for a data converter in a wireless communication system includes third and first resistors R3 and R1 that are sequentially connected to an input end (Vi), a second resistor R2, one end of which is connected to an inverting input end −Vi, first and second capacitors C1 and C2 connected to another end of the first resistor R1 and an output end Vo, a third capacitor C3 connected to between the other end of the first resistor R1 and the output end Vo.

a fourth capacitor C4 connected to between another end of the second resistor R2 and the inverting output end −Vo, and an operational amplifier COM1, wherein the inverting end (−) of the operational amplifier is connected to another end of the third resistor R3 and a non-inverting end (+) of the operational amplifier is connected to ground so that an operational amplifier response is output to the output end Vo.

In conclusion, the third order LF of FIG. 8 includes a single operational amplifier COM1, three resistors R1 to R3, and four capacitors C1 to C4, so the number of operational amplifiers thereof decreases by two in comparison to a typical LF of FIG. 3.

−1 indicated by reference numerals 80 and 82 in FIG. 8 represents a signal applied from an opposite circuit output when a fully differential circuit is implemented. A difference between typical technologies and the proposed circuit configuration of FIG. 8 is a serial connection between the resistor R1 and the capacitor C1. Through such a serial connection, the impedance of (SC1R1+1)/SC1 is formed and a negative input signal is connected to node Vx through the resistor R2 so that a third order transfer function may be expressed.

The transfer function of the proposed loop circuit may be expressed as follows:

$$\frac{V_o}{V_i} = -\frac{\left(\frac{1}{C_3R_3}\right)\cdot s^2 + \left\{\frac{C_1(R_1+R_2-R_3)+C_4R_2}{C_1C_3R_1R_2R_3\cdot(C_2+C_4)}\cdot s + \frac{1}{C_1C_3R_1R_2R_3}\cdot\frac{1}{C_2+C_3}\right\}}{s\cdot\left[s^2 + \frac{1}{C_2+C_3}\left\{\frac{1}{R_1}\left(1+\frac{C_2}{C_1}+\frac{C_4}{C_1}+\frac{C_2}{C_3}-\frac{C_4}{C_3}\right)+\frac{1}{R_2}\right\}\cdot s + \frac{1}{C_1(C_2+C_4)R_1R_2}\right]}$$

The form of such a transfer function enables the form of the transfer function presented in FIGS. 4 and 5 to be implemented. In order to configure a circuit in the same form as the transfer function presented in FIGS. 4 and 5, the term $s^2$ of denominator should be zero. Thus, the following resonance condition should be satisfied:

$$R_2\cdot(C_1C_3+C_2C_3+C_3C_4+C_1C_2)+R_1\cdot(C_1C_3)=R_2\cdot(C_1C_4).$$

Thus, in order to satisfy the resonance condition of a circuit according to a PVT variation, there is a need to change each capacitor and resistor. However, when adjusting the capacitor C2 and the resistor R1 that a left side and a right side may be adjusted in the above expression, the adjustment of the resonance condition would be better.

In conclusion, another third order LF may also be configured through the circuit configuration as shown in FIG. 8.

Figure 9:
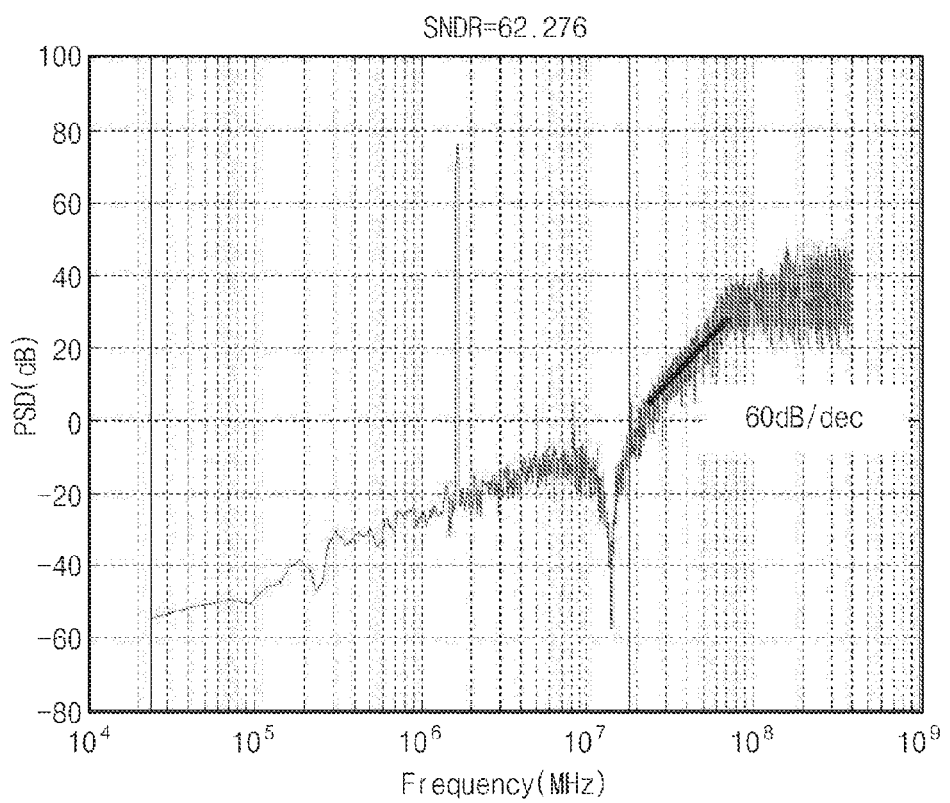
FIG. 9 is a diagram representing the results of simulation according to FIG. 7.
Figure 10:
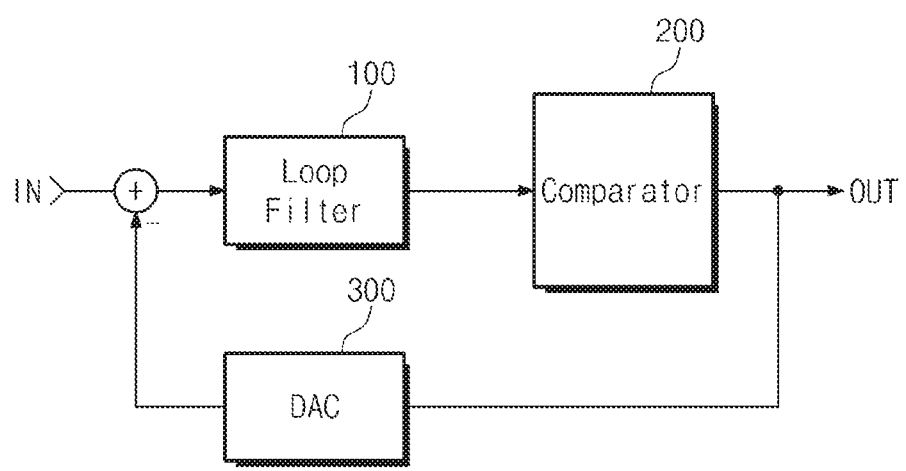
FIG. 10 is a circuit block diagram of a third order continuous time SDM that includes FIG. 7.

FIG. 9 is a diagram representing the results of simulation according to FIG. 7. FIG. 10 is a circuit block diagram of a third order continuous time SDM that includes FIG. 7.

In conclusion, in order to configure a third order 2-level DSM by using a third order LF proposed in an embodiment of the inventive concept, a comparator 200 and a DAC 300 that are formed in the form of a closed loop may be further included in addition to a LF 100 as shown in FIG. 10.

The results of simulation of the third order 2-level DSM having a circuit as shown in FIG. 10 is represented through FIG. 9.

In FIG. 9, the horizontal axis represents frequency and the vertical axis represents magnitude. The results of simulation shown in FIG. 9 are obtained by the applying of an input of about 1.5 MHz to the input end of the DSM, the capturing of a waveform generated from the DSM and the performing of Fast Fourier Transform (FFT).

Since through the third order LF, the noise transfer function of the output spectrum of the DSM is represented by 60 dB/dec, it is possible to see that the proposed LF in the embodiment of the inventive concept properly operates. Also, through the results of simulation, it is also possible to see that the DSM operating through about 1 GHz clock for about 15 MHz bandwidth shows an SNDR characteristic of about 62 dB.

Thus, since the third order LF is implemented by using a single operational amplifier, a signal delay generating through the operational amplifier is delayed. Thus, delay time compensation in a communication system, especially an envelope pulse width modulation transmitter (EPWM) is simplified.

Also, there are advantages in that it is easy to control the STF/NTF characteristic variation of the LF according to a PVT variation and it is possible to select an optimal LF structure in order to select the proper values of R and C when a third order DSM is designed.

According to an embodiment of the inventive concept, both the anti-aliasing filtering characteristic and power consumption characteristic in the LF are improved. Also, when an LF for the continuous time DSM is implemented, the third order LF using only a single operational amplifier is implemented.

As described above, optimal embodiments are disclosed through the drawings and specification. Although specific terms are used herein, they are only used for describing the inventive concept and not for limiting meanings or the scope of the inventive concept disclosed in the following claims. Therefore, a person skilled in the art would understand that it is possible to implement various variations and equivalents. The circuit configuration has been described for example, but in other cases, it is possible to alter details by changing, adding or eliminating components in the drawings without departing from the technical spirit of the inventive concept.

What is claimed is:

1. A loop filter for a data converter in a wireless communication system, the loop filter comprising:
   first and third resistors sequentially connected to an input end;
   fourth and second resistors sequentially connected to between an inverting output end and ground;
   a first capacitor connected to between another end of the first resistor and one end of the fourth resistor;
   a second capacitor connected to between the one end of the fourth resistor and the output end;
   a third capacitor connected to between another end of the third resistor and the output end; and
   an operational amplifier configured to output an operational amplifier response to the output end, wherein an inverting end of the operational amplifier is connected to the other end of the first resistor and a non-inverting end of the operational amplifier is connected to ground.

2. The loop filter of claim 1, wherein an output signal opposite to when a differential circuit is implemented is applied to between another end of the fourth resistor and the output end.

3. The loop filter of claim 1, wherein a serial connection between the third resistor and the third capacitor implements a third order transfer function by the forming of an impedance of (SC3R3+1)/SC4.

4. The loop filter of claim 1, wherein the loop filter satisfies the following resonance condition:

$$R_4 \cdot (C_1C_3 + C_2C_3 + C_1C_3) = R_3 \cdot (C_1C_3).$$

5. A method of implementing a loop filter, the method comprising:
   forming a loop filter for a continuous time signal delta modulator (SDM), in a feedback loop structure;
   configuring the loop filter in the feedback loop structure to enable the loop filter to be entirely expressed by a first single transfer function
   substituting a feedforward loop structure for the loop filter in the feedback loop structure; and
   configuring the loop filter in the feedforward loop structure obtained through substitution to enable the loop filter to be entirely expressed by a second single transfer function.

6. The method of claim 5, wherein the forming of the feedback loop structure reinforces an anti-aliasing filtering characteristic of the loop filter through an implementation of the first single transfer function.

7. The method of claim 5, wherein the substituting of the feedforward loop structure reinforces a power consumption characteristic of the loop filter through an implementation of the second single transfer function.

8. A loop filter for a data converter in a wireless communication system, the loop filter comprising:
   third and first resistors sequentially connected to an input end;
   a second resistor, one end of which is connected to an inverting input end;
   first and second capacitors sequentially connected to between another end of the first resistor and an output end;
   a third capacitor connected to between the other end of the first resistor and the output end;
   a fourth capacitor connected to between another end of the second resistor and an inverting output end; and
   an operational amplifier configured to output an operational amplifier response to the output end, wherein an inverting end of the operational amplifier is connected to another end of the third resistor and a non-inverting end of the operational amplifier is connected to ground.

9. The loop filter of claim 8, wherein an output signal opposite to when a differential circuit is implemented is applied to between the one end of the second resistor and the input end and between the fourth capacitor and the output end.

10. The loop filter of claim 8, wherein a serial connection between the first resistor and the first capacitor implements a third order transfer function by the forming of an impedance of $(SC1R1+1)/SC1$.

11. The loop filter of claim 8, wherein the loop filter satisfies the following resonance condition:

$$R_2 \cdot (C_1C_3 + C_2C_3 + C_3C_4 + C_1C_2) + R_1 \cdot (C_1C_3) = R_2 \cdot (C_1C_4).$$

12. A method of implementing a loop filter, the method comprising:
   forming a loop filter for a third order continuous time SDM, in a feedback loop structure by using at least three operational amplifiers and capacitors;
   configuring the loop filter in the feedback loop structure to enable the loop filter to be entirely expressed by a first single transfer function;
   substituting a feedforward loop structure for the loop filter in the feedback loop structure; and
   configuring the loop filter in the feedforward loop structure obtained through substitution to enable the loop filter to be entirely expressed by a second single transfer function.

13. The method of claim 12, wherein the first single transfer function and the second single transfer function have different coefficients but are expressed in a same form.

14. The method of claim 12, wherein the loop filter is an integrator circuit applied to the DSM.

* * * * *